United States Patent
Kawamura

(10) Patent No.: US 9,000,772 B2
(45) Date of Patent: Apr. 7, 2015

(54) INSULATED CONDITION DETECTOR WITH FAULT DETECTION AND LOCATION

(75) Inventor: Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 53 days.

(21) Appl. No.: 14/003,252

(22) PCT Filed: Feb. 7, 2012

(86) PCT No.: PCT/JP2012/000811
§ 371 (c)(1),
(2), (4) Date: Sep. 5, 2013

(87) PCT Pub. No.: WO2012/120778
PCT Pub. Date: Sep. 13, 2012

(65) Prior Publication Data
US 2013/0342215 A1   Dec. 26, 2013

(30) Foreign Application Priority Data
Mar. 9, 2011 (JP) ................. 2011-051640

(51) Int. Cl.
*G01R 31/14* (2006.01)
*G01R 31/02* (2006.01)
*G01R 31/08* (2006.01)
*G01R 27/18* (2006.01)
(Continued)

(52) U.S. Cl.
CPC ............. *G01R 31/08* (2013.01); *G01R 31/021* (2013.01); *G01R 27/18* (2013.01); *G01R 31/006* (2013.01); *G01R 31/025* (2013.01); *G01R 35/00* (2013.01)

(58) Field of Classification Search
CPC ..... G01R 31/00; G01R 31/005; G01R 31/006; G01R 31/02; G01R 31/021; G01R 31/022; G01R 31/024; G01R 31/025; G01R 31/026; G01R 31/08; G01R 27/18; B60L 3/0069
USPC ......... 324/500, 509, 510, 537, 541, 544, 551, 324/555, 557; 361/42
See application file for complete search history.

(56) References Cited

U.S. PATENT DOCUMENTS 8,232,806 B2 *   7/2012   Kawamura .................... 324/509
8,373,424 B2 *   2/2013   Kawamura .................... 324/548
(Continued)

FOREIGN PATENT DOCUMENTS

JP   2004-170137 A   6/2004
JP   2007-170983 A   7/2007

OTHER PUBLICATIONS

Chinese office action letter issued on Dec. 24, 2014 in the counterpart Chinese patent application.

*Primary Examiner* — Hoai-An D Nguyen
(74) *Attorney, Agent, or Firm* — Marvin A. Motsenbocker; MOTS Law, PLLC

(57) ABSTRACT

If a charge voltage of a read capacitor Ca measured by a microcomputer 15 is zero, the microcomputer 15 measures a charge voltage of the read capacitor Ca after the read capacitor Ca is discharged and is charged by a charge supply circuit 17 to predetermined potential, measures the same when the read capacitor Ca is isolated thereafter from a discharger of a flying capacitor C1, and measures the same when the read capacitor Ca is charged thereafter with a discharge voltage of the flying capacitor C1 just after the start of discharge of the flying capacitor C1. Based on a pattern of the charge voltage values of the read capacitor Ca measured at the respective time points, a fault location of the insulated condition detector 10 is identified.

3 Claims, 4 Drawing Sheets

(51) Int. Cl.
*G01R 31/00* (2006.01)
*G01R 35/00* (2006.01)

(56) References Cited

U.S. PATENT DOCUMENTS

| | | | |
|---|---|---|---|
| 8,786,248 B2 * | 7/2014 | Nishizawa et al. | 320/103 |
| 8,860,426 B2 * | 10/2014 | Kawamura | 324/509 |
| 2008/0079416 A1 | 4/2008 | Kawamura | |
| 2008/0084217 A1 | 4/2008 | Hartzog et al. | |
| 2009/0289639 A1 | 11/2009 | Kawamura et al. | |
| 2009/0289640 A1 | 11/2009 | Kawamura et al. | |
| 2011/0006781 A1 | 1/2011 | Kawamura | |
| 2012/0262183 A1 * | 10/2012 | Kawamura | 324/509 |
| 2013/0147491 A1 * | 6/2013 | Kawamura | 324/509 |

* cited by examiner

INSULATED CONDITION DETECTOR WITH FAULT DETECTION AND LOCATION

TECHNICAL FIELD

The present invention relates to a unit for detecting a ground fault or an insulated condition of an ungrounded power source with respect to a ground potential portion, and particularly, to an apparatus for detecting a fault of a flying capacitor that is used to detect a ground fault or an insulated condition.

BACKGROUND ART

A vehicle that uses electricity as driving energy usually employs a high-voltage (for example, 200 V) DC power source configured as an ungrounded power source insulated from a vehicle body. To detect a ground fault or an insulated condition of the ungrounded power source with respect to the vehicle body, i.e., a ground potential portion, a detecting unit employs a flying capacitor.

The detecting unit controls internal switches to charge the flying capacitor with a charge amount corresponding to a voltage of the DC power source insulated from the ground potential portion, a charge amount corresponding to a ground fault resistance on the positive terminal side of the DC power source, and a charge amount corresponding to a ground fault resistance on the negative terminal side of the DC power source. Thereafter, a controller of the detecting unit measures a charge voltage at each of the charge amounts, calculates the ground fault resistances on the positive and negative terminal sides of the DC power source, and detects a ground fault or an insulated condition of the DC power source. A related document is, for example, Japanese Unexamined Patent Application Publication NO. 2007-170983.

SUMMARY OF INVENTION

Technical Problem

A charge voltage of the flying capacitor is measured as a discharge voltage thereof by disconnecting the flying capacitor from the DC power source and by discharging the flying capacitor. In connection with discharging the flying capacitor, fast discharge is needed to quickly start the next charging of the same. On the other hand, in connection with measuring the discharge voltage, a voltage value close to a charge voltage of the flying capacitor just before discharge must be measured, and therefore, it is required to measure the discharge voltage at proper timing just after starting the discharge.

In view of this subject, the present invention provides an insulated condition detector that employs a flying capacitor to detect a ground fault or an insulated condition by charging the flying capacitor with a charge amount corresponding to a power source voltage or a ground fault resistance of a DC power source and by accurately measuring a charge voltage of the flying capacitor at proper timing.

Solution to Problem

The present invention realizes fast discharge of the flying capacitor disconnected from the DC power source, as well as a discharge voltage measurement just after the start of discharge of the flying capacitor. For this, the present invention holds a discharge voltage value at the start of discharge of the flying capacitor in a separate circuit. With this, the present invention can continuously discharge the flying capacitor, and at the same time, can measure the value held in the separate circuit to measure the discharge voltage value just after the start of discharge of the flying capacitor.

If the value held in the separate circuit is measured as 0 V, it is unrealistic that the discharge voltage value at the start of discharge of the flying capacitor is 0 V. Then, it is appropriate to consider that the separate circuit or peripheral circuits are faulty. The fact that the measured value is 0 V is insufficient to identify the cause thereof because circumstances are unclear. For example, it is unclear whether or not 0 V has been held from the beginning, or whether or not the held value has decreased to 0 V as time passes.

The present invention is capable of identifying the cause if a discharge voltage value held in the separate circuit at the start of discharge of the flying capacitor is clearly abnormal.

According to a technical aspect of the present invention, the insulated condition detector of the present invention detects an insulated condition of a DC power source insulated from a ground potential portion according to a charge voltage of a flying capacitor charged with a charge amount corresponding to a voltage of the DC power source and a charge voltage of the flying capacitor through an insulation resistance measuring circuit of the DC power source including an insulation resistance of the DC power source. The insulated condition detector includes a peak holder that is selectively connected to a discharger of the flying capacitor at the start of discharge of the flying capacitor, charges a hold capacitor with potential corresponding to a peak value of a discharge voltage of the flying capacitor, and holds the potential, a hold value measuring unit that measures, after the start of discharge of the flying capacitor and in a state that the peak holder is electrically isolated from the discharge circuit, the potential held in the peak holder, a charge voltage detector that detects a charge voltage of the flying capacitor according to the value measured by the hold value measuring unit, a test charger that charges, if the potential held in the peak holder and measured by the hold value measuring unit is zero, the hold capacitor with predetermined potential in the electrically insulated state from the discharger, a test measuring unit that measures, after the charging by the test charger, a charge voltage of the hold capacitor, and a fault detector that detects a fault location according to the values measured by the hold value measuring unit and test measuring unit.

A circuit diagram illustrating an insulated condition detector according to an embodiment of the present invention.

FIG. 2

Figure 1:
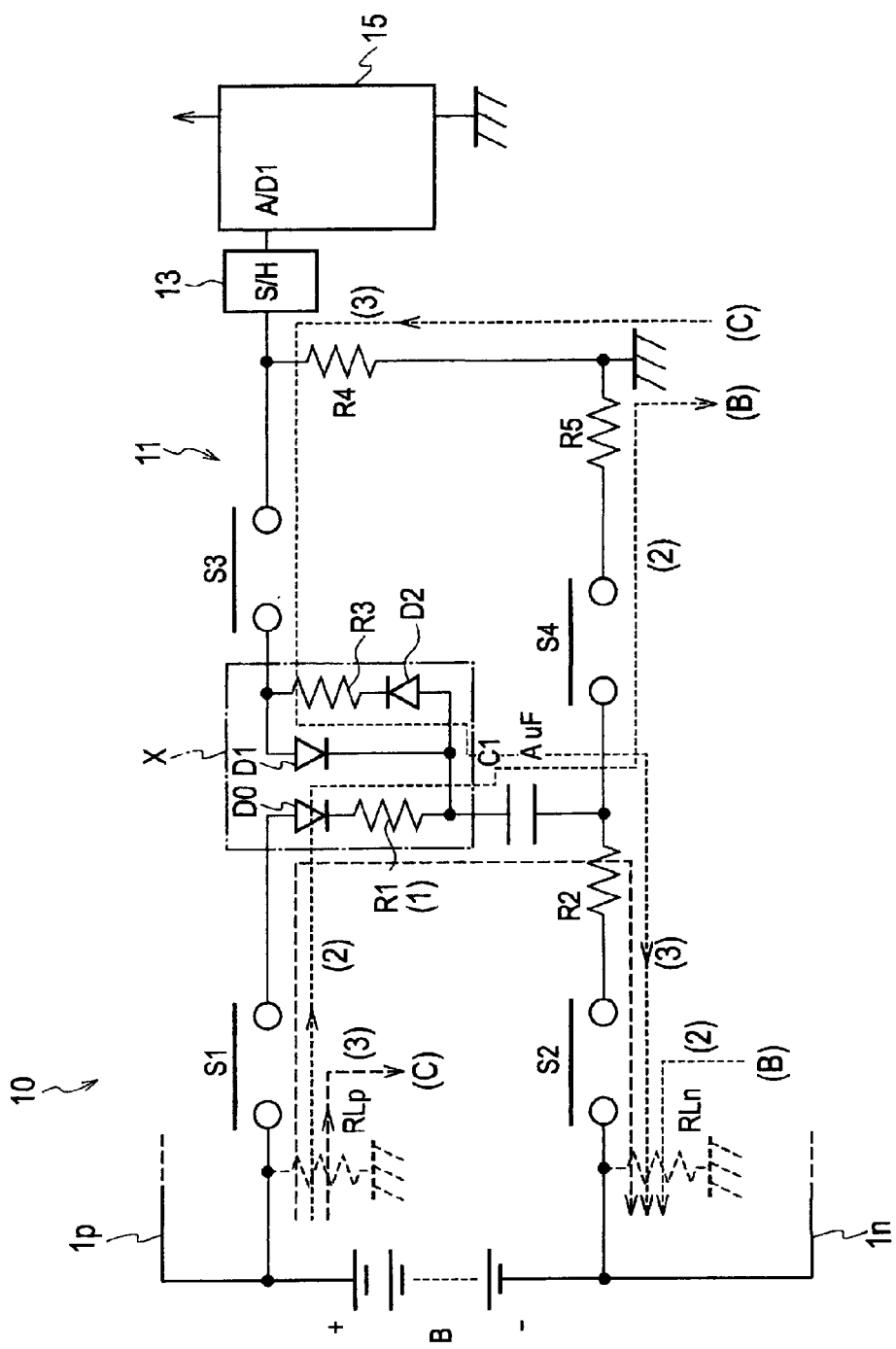
FIG. 1

A circuit diagram illustrating a sample and hold circuit of FIG. 1.

FIG. 3

Figure 2:
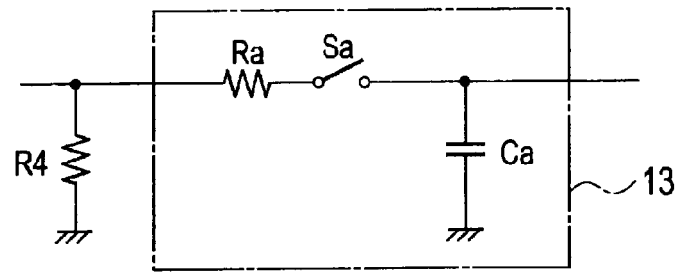

A time chart illustrating a relationship between ON/OFF of switches of FIGS. 1 and 2 and capacitor charge states.

FIG. 4

A time chart illustrating timing of carrying out a fault detecting operation by the insulated condition detector of FIG. 1.

FIG. 5

A circuit diagram illustrating a charge supply circuit installed in the insulated condition detector of FIG. 1.

FIG. 6

A flowchart illustrating a fault detecting process carried out by a microcomputer of the insulated condition detector of FIG. 1 according to a program stored in a ROM.

DESCRIPTION OF EMBODIMENTS

An embodiment of the present invention will be explained with reference to the drawings.

FIG. 1 is a circuit diagram illustrating an insulated condition detector according to an embodiment of the present invention. The insulated condition detector of the present embodiment is a unit configured to detect a ground fault or an insulated condition of main circuit wiring 1p on the positive terminal side of a DC power source B that is insulated from a ground potential portion such as a body of a vehicle (not illustrated), or that of main circuit wiring 1n on the negative terminal side of the DC power source B.

In FIG. 1, "RLp" represents a ground fault resistance on the positive terminal side and "RLn" represents a ground fault resistance on the negative terminal side. These ground fault resistances RLp and RLn are imaginary resistances that may occur when the main circuit wiring 1p on the positive terminal side or the main circuit wiring 1n on the negative terminal side causes a ground fault.

The insulated condition detector 10 for detecting a ground fault or an insulated condition of the main circuit wiring 1p or 1n includes a ground fault detector 11 having the flying capacitor C1, a sample-and-hold circuit 13 that samples and holds a charge or discharge voltage of the flying capacitor C1, and a microcomputer (microcontroller) 15 that detects a value held in the sample and hold circuit 13 and measures a charge/discharge voltage of the flying capacitor C1. The flying capacitor C1 according to the present embodiment is a ceramics capacitor.

In addition to the flying capacitor C1, the ground fault detector 11 includes switches S1 and S2 that selectively connect the flying capacitor C1 to the positive and negative electrodes of the DC power source B and switches S3 and S4 that selectively connect the flying capacitor C1 to the microcomputer 15 and ground potential portion. Between the flying capacitor C1 and the switch S1, a resistor R1 is connected in series. Between the flying capacitor C1 and the switch S2, a resistor R2 is connected in series.

When the microcomputer 15 measures a charge or discharge voltage of the flying capacitor C1, insulation of the DC power source B must be secured. For this, the resistors R1 and R2 have the same high resistance value.

FIG. 2 is a circuit diagram illustrating the sample and hold circuit 13. The sample and hold circuit 13 includes a switch Sa having a first end connected to a first A/D conversion port A/D1 of the microcomputer 15, a read capacitor Ca connected between the first end of the switch Sa and the ground potential portion, and a resistor Ra connected in series between a second end of the switch Sa and the switch S3.

While the switch Sa is being closed, the read capacitor Ca is charged with potential appearing through the resistor Ra at the first end of the switch Sa.

The microcomputer 15 operates with a power source (not illustrated) whose voltage is lower than the voltage of the DC power source B, so that the DC power source B is isolated from the ground potential of the microcomputer 15. The switches S1 to S4 of the ground fault detector 11 and the switch Sa of the sample and hold circuit 13 are, for example, optical MOSFETs that are insulated from the DC power source B and are turned on/off by the microcomputer 15.

The first A/D conversion port A/D1 of the microcomputer 15 is connected through the sample and hold circuit 13 to the switch S3. A connection point of the sample and hold circuit 13 and switch S3 is grounded through a resistor R4. Between the switch S4 and the ground potential portion, a resistor R5 is connected. The switches S1 and S3 on the first end side (the upper electrode side in FIG. 1) of the flying capacitor C1 are connected in series. Between a connection point of the switches S1 and S3 and the first end of the flying capacitor C1, a current direction switching circuit X is connected.

The current direction switching circuit X is a parallel circuit including a series circuit that includes a diode D0 whose forward direction is oriented from the switch S1 toward the first end of the flying capacitor C1 and a resistor R1, a circuit that includes a diode D1 whose forward direction is oriented from the switch S3 toward the first end of the flying capacitor C1, and a series circuit that includes a diode D2 whose forward direction is oriented from the first end of the flying capacitor C1 toward the switch S3 and a resistor R3.

A sequence of detecting a ground fault or an insulated condition of the DC power source B carried out by the insulated condition detector 10 will be explained. First, the microcomputer 15 turns on the switches S1 and S2 and off the switches S3, S4, and Sa for a predetermined time. The predetermined time is shorter than a time necessary for completely charging the flying capacitor C1.

This creates a charging circuit extending along the positive electrode of the DC power source B, the main circuit wiring 1p on the positive terminal side, the switch S1, the diode D0, the resistor R1, the first end (the upper electrode in FIG. 1) of the flying capacitor C1, the second end (the lower electrode in FIG. 1) of the flying capacitor C1, the resistor R2, the switch S2, the main circuit wiring 1n on the negative terminal side, and the negative electrode of the DC power source B. This charging circuit is referred to as a first charging circuit.

In the first charging circuit, the flying capacitor C1 is charged with a charge amount corresponding to a voltage of the DC power source B. Due to the charging, the first end of the flying capacitor C1 becomes a positive electrode and the second end thereof becomes a negative electrode.

Thereafter, the microcomputer 15 turns off the switches S1 and S2 and turns on the switches S3 and S4. This connects the positive electrode of the flying capacitor C1 through the diode D2, resistor R3, and switch S3 to the sample and hold circuit 13 and the negative electrode of the flying capacitor C1 through the switch S4 and resistor R5 to the ground potential portion. As a result, the flying capacitor C1 discharges.

Figure 3:
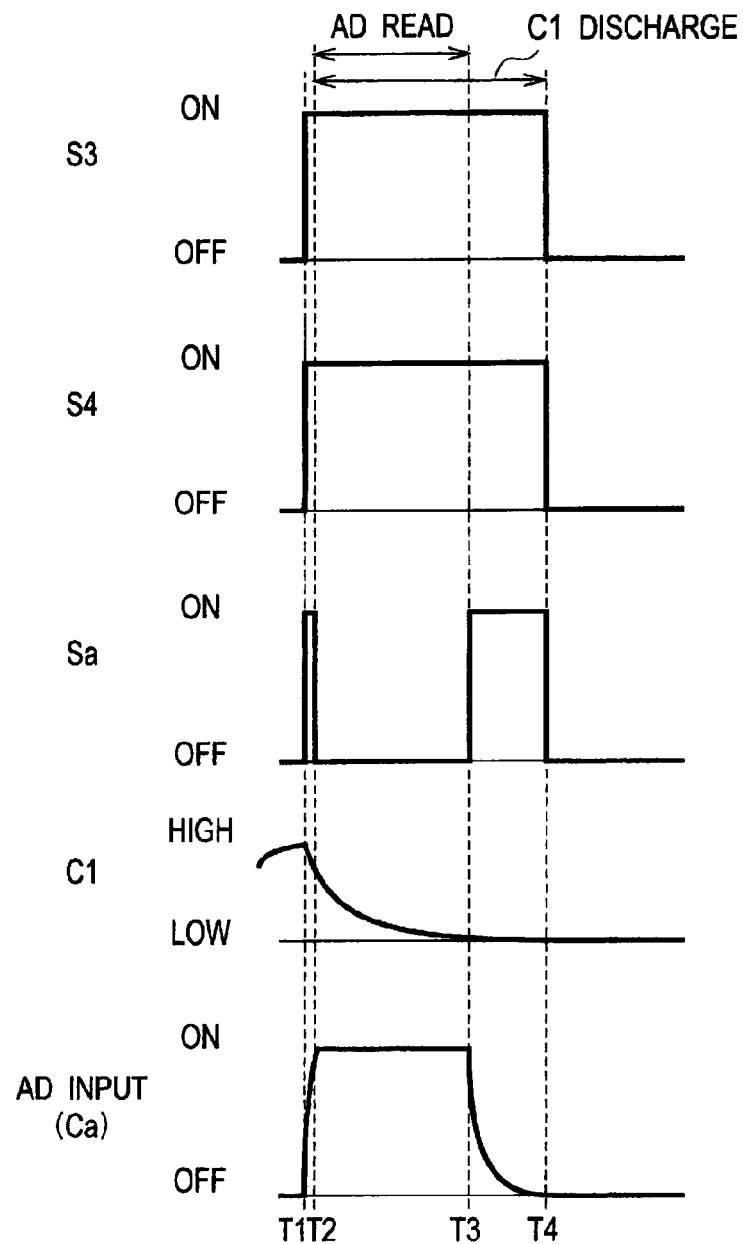

As illustrated in the time chart of FIG. 3, the microcomputer 15 turns on the switches S3 and S4 at time T1, and at the same time, turns on the switch Sa of the sample and hold circuit 13 for a short time (an interval between T1 and T2, for example, 200 to 300 [us (micro seconds)]. As a result, the charge voltage of the flying capacitor C1 is divided by the resistors R3 and R4 and a driving force corresponding to a voltage across the resistor R3 charges the read capacitor Ca.

When the flying capacitor C1 starts to discharge, the flying capacitor C1 has the charge amount corresponding to the voltage of the DC power source B. Accordingly, when the read capacitor Ca is charged with a discharge voltage of the flying capacitor C1 just after the start of discharge of the flying capacitor C1, a charge amount of the read capacitor Ca is equal to the charge amount corresponding to the voltage of the DC power source B multiplied by a voltage dividing ratio of the resistors R4 and R5.

The microcomputer 15 turns off the switch Sa of the sample and hold circuit 13 at time T2 and the charge voltage divided potential of the read capacitor Ca is outputted from the sample and hold circuit 13 to the first A/D conversion port A/D1 of the microcomputer 15 and is measured. According to the measured value, the voltage dividing ratio of the resistors R3 and R4, and the voltage dividing ratio of the resistors R4 and R5, the microcomputer 15 calculates the charge voltage Vc1 of the flying capacitor C1 corresponding to the voltage of the DC power source B.

After the switch Sa of the sample and hold circuit 13 is turned off and while the charge voltage Vc1 of the flying capacitor C1 is being measured, the switches S3 and S4 are ON, and therefore, the flying capacitor C1 continuously discharges.

When completing the measurement of the charge voltage Vc1 of the flying capacitor C1 at time T3, the microcomputer 15 turns on the switch Sa of the sample and hold circuit 13. This discharges the flying capacitor C1 and read capacitor Ca. When these capacitors C1 and Ca are completely discharged at time T4, the microcomputer 15 turns off the switches S3, S4, and Sa.

After completely discharging the flying capacitor C1 and read capacitor Ca, the microcomputer 15 turns on the switches S1 and S4 and off the switches S2 and S3 for the above-mentioned predetermined time.

This creates a charging circuit along the positive electrode of the DC power source B, the main circuit wiring 1p on the positive terminal side, the switch S1, the diode D0, the resistor R1, the first end of the flying capacitor C1, the second end of the flying capacitor C1, the switch S4, the resistor R5, (the ground potential portion,) the ground fault resistance RLn on the negative terminal side, the main circuit wiring in on the negative terminal side, and the negative electrode of the DC power source B. This charging circuit is referred to as a second charging circuit.

In the second charging circuit, the flying capacitor C1 is charged with a charge amount corresponding to the ground fault resistance RLn on the negative terminal side. Due to this, the first end of the flying capacitor C1 becomes a positive electrode and the second end thereof becomes a negative electrode.

Thereafter, the microcomputer 15 turns off the switches S1 and S2 and turns on the switches S3 and S4 at T1 of FIG. 3. At the same time, the microcomputer 15 turns on the switch Sa of the sample and hold circuit 13 for a short time (the interval between T1 and T2 in FIG. 3, for example, 200 to 300 us).

Until the microcomputer 15 again turns on the switch Sa of the sample and hold circuit 13, i.e., during an interval between T2 and T3 of FIG. 3, the microcomputer 15 measures a charge voltage Vc1− of the flying capacitor C1 corresponding to the ground fault resistance RLn on the negative terminal side, like measuring the charge voltage Vc1 of the flying capacitor C1 corresponding to the voltage of the DC power source B.

Thereafter, the microcomputer 15 completely discharges the flying capacitor C1 and read capacitor Ca, turns on the switches S2 and S3, and turns off the switches S1 and S4 for the above-mentioned predetermined time.

This creates a charging circuit extending along the positive electrode of the DC power source B, the main circuit wiring 1p on the positive terminal side, the ground fault resistance RLp on the positive terminal side, (the ground potential portion,) the resistor R4, the switch S3, the diode D1, the flying capacitor C1, the resistor R2, the switch S2, the main circuit wiring in on the negative terminal side, and the negative electrode of the DC power source B. This charging circuit is referred to as a third charging circuit.

In the third charging circuit, the flying capacitor C1 is charged with a charge amount corresponding to the ground fault resistance RLp on the positive terminal side. This makes the first end of the flying capacitor C1 positive and the second end thereof negative.

Thereafter, the microcomputer 15 turns off the switches S1 and S2 and turns on the switches S3 and S4 at time T1 in FIG. 3. At the same time, the microcomputer 15 turns on the switch Sa of the sample and hold circuit 13 for a short time. This ON time is the interval between T1 and T2 in FIG. 3 and is, for example, 200 to 300 [us (micro seconds)].

Until the microcomputer 15 again turns on the switch Sa of the sample and hold circuit 13, i.e., during the interval between T2 and T3 of FIG. 3, the microcomputer 15 measures a charge voltage Vc1+ of the flying capacitor C1 corresponding to the ground fault resistance RLp on the positive terminal side, like measuring the charge voltage Vc1 of the flying capacitor C1 corresponding to the voltage of the DC power source B and like measuring the charge voltage Vc1− of the flying capacitor C1 corresponding to the ground fault resistance RLn on the negative terminal side. Thereafter, the flying capacitor C1 and read capacitor Ca are completely discharged.

The charge voltage Vc1 of the flying capacitor C1 corresponding to the voltage of the DC power source B, the charge voltage Vc1− of the flying capacitor C1 corresponding to the ground fault resistance RLn on the negative terminal side, and the charge voltage Vc1+ of the flying capacitor C1 corresponding to the ground fault resistance RLp on the positive terminal side can be related to a parallel resultant resistance value R of the ground fault resistance RLp on the positive terminal side and ground fault resistance RLn on the negative terminal side. Namely, the resultant resistance R can be expressed as a function of "$\{(Vc1+)+(Vc1-)\}/Vc1$".

According to this relationship, the microcomputer 15 calculates the parallel resultant resistance value of the ground fault resistances RLp and RLn on the positive and negative terminal sides, to detect a ground fault or an insulated condition of the DC power source B.

The ceramics capacitor used as the flying capacitor C1 in the ground fault detector 11 according to the embodiment greatly changes its capacitance depending on a DC bias. The capacitance of the flying capacitor C1 also varies depending on ambient temperature and an individual characteristic difference of the ceramics capacitor used as the flying capacitor C1.

To eliminate the influence of such variations in the capacitance of the flying capacitor C1, the sequence of measuring the charge voltages Vc1, Vc1−, and Vc1+ carried out by the microcomputer 15 may be changed. This will be explained.

If the capacitance of the flying capacitor C1 decreases lower than that in a normal state, a charge amount achieved by charging the flying capacitor C1 for a certain period increases higher than that in the normal state. As a result, a discharge amount of the flying capacitor C1 becomes higher for a certain interval from the start of discharge.

On the other hand, if the capacitance of the flying capacitor C1 increases higher than that in the normal state, a charge amount achieved by charging the flying capacitor C1 for a certain period decreases lower than that in the normal state. As a result, a discharge amount of the flying capacitor C1 becomes lower for a certain interval from the start of discharge.

When a certain time elapses after the start of discharge, the discharging flying capacitor C1 approaches saturation, and therefore, a discharge amount of the flying capacitor C1 after the saturation is nearly equalized without regard to whether the capacitance of the flying capacitor C1 is higher or lower than that in the normal state.

This means that, although the charge amount of the flying capacitor C1 widely varies depending on the capacitance characteristic of the flying capacitor C1, variations in the discharge voltage of the flying capacitor C1 become smaller a certain time after the start of discharge. More precisely, a discharge voltage VD1 at the start of discharge after charging the flying capacitor C1 for a predetermined time t1 and a discharge voltage VD2 after a period t2 from the start of discharge of the flying capacitor C1 have the following relationship:

$$V_{D1} = V_0 \left[ 1 - \exp\left\{ -\left(\frac{t_1}{C_1 a R_c}\right) \right\} \right]$$
$$V_{D2} = V_0 \exp\left\{ -\left(\frac{t_2}{C_1 a R_d}\right) \right\},$$

[Math. 1]

where, $V_0$ is a charge voltage, C1 is a capacitance of the flying capacitor C1, RC is a charging resistance value, RD is a discharge resistance value, and a is a variation coefficient of the capacitance of the flying capacitor C1 (a ratio with respect to a normal-state capacitance).

As is apparent in the above relationships, a variation that decreases the capacitance of the flying capacitor C1 increases the discharge voltage VD1 at the start of discharge and the discharge voltage VD2 after the period t2 from the start of discharge. On the other hand, a variation that increases the capacitance of the flying capacitor C1 decreases the discharge voltages VD1 and VD2.

It is understood that an increase or a decrease in the charge amount of the flying capacitor C1 with respect to the charge amount of the flying capacitor C1 in the normal state is canceled by an increase or a decrease in the discharge amount of the flying capacitor C1 that occurs for a certain period after the start of discharge.

Namely, there will be two ways to find, from a discharge voltage of the flying capacitor C1, a charge voltage V0 of the flying capacitor C1 after charging the flying capacitor C1 for the predetermined time t1. The two ways are as follows:

(i) Finding the charge voltage $V_0$ by use of the discharge voltage $V_{D2}$ $$V_0 = V_{D2} / \{(\text{discharge ratio based on } t2 \text{ and } C1 \times R_D) \times (\text{charging ratio based on } t1 \text{ and } C1 \times R_C)\} \quad (1),$$

where "discharge ratio" is a charge residual ratio after discharge and "charging ratio" is a charge residual ratio after charging;

(ii) Finding the charge voltage $V_0$ by use of the discharge voltage $V_{D1}$ $$V_0 = V_{D1} / (\text{charging ratio based on } t1 \text{ and } C1 \times R_C) \quad (2).$$

As mentioned above, finding the charge voltage V0 with the use of the discharge voltage VD2 according to the expression (1) is more accurate than finding the charge voltage V0 with the use of the discharge voltage VD1 according to the expression (2).

Accordingly, after a certain time from the start of discharge of the flying capacitor C1, the microcomputer 15 turns off the switches S1 and S2 and turns on the switches S3, S4, and Sa (at T1 in FIG. 3). Shortly thereafter, the microcomputer 15 turns off the switch Sa. During this short period (from T1 to T2 in FIG. 3), the read capacitor Ca is charged and potential obtained by dividing a charge voltage of the read capacitor Ca at this time is measured through the first A/D conversion port A/D1 of the microcomputer 15. According to the measured potential, the microcomputer 15 calculates the charge voltage of the flying capacitor C1.

In this way, the charge voltages Vc1, Vc1−, and Vc1+ of the flying capacitor C1 may be obtained from the discharge voltage VD2 that is measured a certain time (t2) after the start of discharge of the flying capacitor C1. Alternatively, the charge voltage Vc1 of the flying capacitor C1 charged with the charge amount corresponding to the voltage of the DC power source B may be obtained from the discharge voltage VD2 and the charge voltage Vc1− of the flying capacitor C1 corresponding to the ground fault resistance RLn on the negative terminal side and the charge voltage Vc1+ of the flying capacitor C1 corresponding to the ground fault resistance RLp on the positive terminal side may be obtained from the discharge voltage VD1 measured at the start of discharge.

A pace to reach a time point when the discharging flying capacitor C1 saturates differs depending on the capacitance of the flying capacitor C1. Accordingly, a time point when a discharge amount of the flying capacitor C1 whose capacitance is abnormal becomes substantially equal to that of the flying capacitor C1 whose capacitance is normal, i.e., the certain period (t2) after the start of discharge differs depending on whether the abnormal capacitance is higher or lower than the normal capacitance.

To deal with this, a period from the start of discharge in which a discharge amount of the flying capacitor C1 whose capacitance is higher than normal becomes substantially equal to that of the normal flying capacitor C1 and a period from the start of discharge in which a discharge amount of the flying capacitor C1 whose capacitance is higher than normal becomes substantially equal to that of the normal flying capacitor C1 are measured and averaged and the averaged period may be used to calculate the discharge voltage VD2.

The timing of carrying out a fault detecting operation by the insulated condition detector 10 of the embodiment will be explained with reference to a time chart of FIG. 4. First, the insulated condition detector 10 measures a voltage of the DC power source B. For this, the switches S1 and S2 are turned on so that the first charging circuit charges the flying capacitor C1 with a charge amount corresponding to the voltage of the DC power source B.

Thereafter, the switches S3 and S4 are turned on to discharge the flying capacitor C1. Slightly after that, the switch Sa is turned on to charge the read capacitor Ca with a discharge voltage of the flying capacitor C1 just after the start of discharge of the flying capacitor C1. Within a short time after that, only the switch Sa is turned off. In this state, the microcomputer 15 measures potential corresponding to a charge voltage of the read capacitor Ca as potential corresponding to the voltage of the DC power source B (normal measurement).

Thereafter, the switch Sa is again turned on. Until the switch Sa is turned off together with the switches S3 and S4, the read capacitor Ca discharges.

The potential corresponding to the charge voltage of the read capacitor Ca measured in the normal measurement by the microcomputer 15 must be a value greater than 0 V if the insulated condition detector 10 is in a normal state. Accordingly, if a result of the normal measurement is 0 V, it is understood that the insulated condition detector 10 is faulty at some location.

Figure 5:
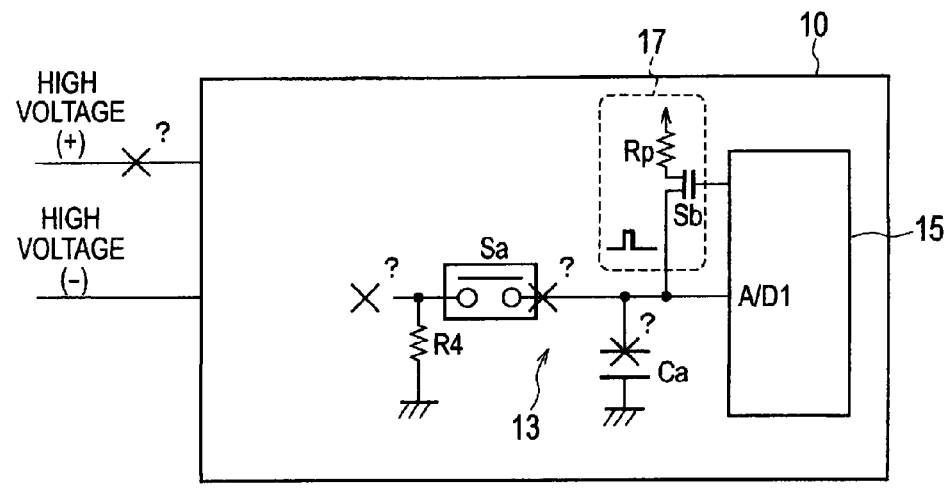

In connection with this, the insulated condition detector 10 of the embodiment has, as illustrated in a circuit diagram of FIG. 5, a charge supply circuit 17 that charges, if required, the read capacitor Ca of the sample and hold circuit 13. The charge supply circuit 17 employs a semiconductor switch Sb such as an FET (Field Effect Transistor), and a pull-up resistor Rp, to pull up potential at a connection point of the read capacitor Ca and the first A/D conversion port A/D1 of the microcomputer 15 up to a predetermined level, if required.

If a result of the normal measurement is 0 V, the microcomputer 15 controls the charge supply circuit 17 together with the ground fault detector 11 and sample-and-hold circuit 13, to carry out a failure detection for the insulated condition detector 10.

Next, the failure detection carried out for the insulated condition detector 10 by the microcomputer 15 according to a failure detecting process program stored in a ROM (not illustrated) will be explained with reference to a flowchart of FIG. 6.

First, the microcomputer 15 confirms whether or not the normal measurement has been carried out (step S1). If it is confirmed that the normal measurement has been carried out (YES in step S1), the microcomputer 15 confirms whether or not a result of the measurement is 0 V (step S3). If it is not 0 V (NO in step S3), the process ends. If it is 0 V (YES in step S3), the microcomputer 15 confirms whether or not a switch failure test (ground fault test) and a discharge process of the flying capacitor C1 have been completed (step S5).

Figure 4:
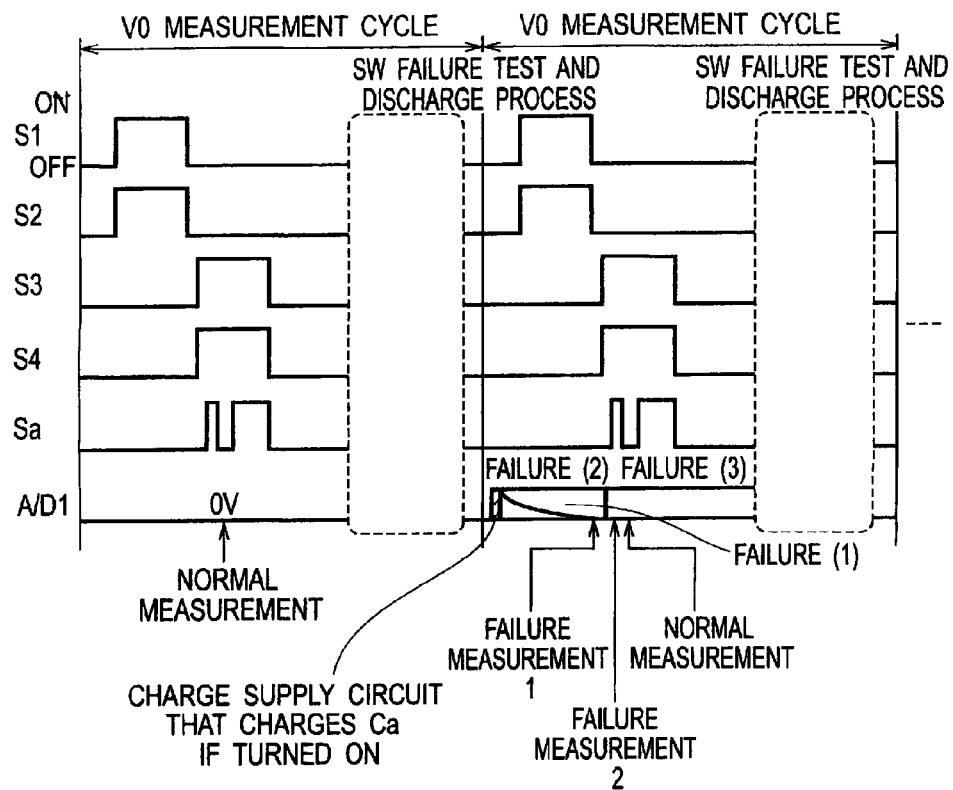

The switch failure test is carried out at the timing surrounded with a dotted frame depicted in the time chart of FIG. 4. The switch failure test is carried out according to the above-mentioned sequence. Namely, the second charging circuit and third charging circuit are established one by one to charge the flying capacitor C1 with a charge amount corresponding to the ground fault resistance RLn on the negative terminal side and that corresponding to the ground fault resistance RLp on the positive terminal side. In each time, the flying capacitor C1 is discharged to charge the read capacitor Ca and the microcomputer 15 measures potential corresponding to a charge voltage of the read capacitor Ca as a charge voltage Vc1− or Vc1+ of the flying capacitor C1 corresponding to the ground fault resistance RLn on the negative terminal side or the ground fault resistance RLp on the positive terminal side.

Using the measured charge voltages Vc1− and Vc1+ and the above-mentioned relational expressions, the microcomputer 15 calculates a parallel resultant resistance value of the ground fault resistances RLp and RLn on the positive and negative terminal sides and detects a ground fault or an insulated condition of the DC power source B. According to the embodiment, the hold value measuring unit and charge voltage detector stipulated in the claims are realized by the microcomputer 15.

If the switch failure test (ground fault test) and the discharge process of the flying capacitor C1 have been completed (YES in step S5), the microcomputer 15 turns on the semiconductor switch Sb for a short time so that the charge supply circuit 17 charges the read capacitor Ca (step S7). When the charging by the charge supply circuit 17 is completed, the microcomputer 15 establishes the first charging circuit to charge the flying capacitor C1 with a charge amount corresponding to the voltage of the DC power source B (step S9).

After the charging through the first charging circuit is completed, the microcomputer 15 executes a failure measurement 1 (refer to FIG. 4) (step S11). In the failure measurement 1, the microcomputer 15 measures potential corresponding to a charge voltage of the read capacitor Ca in an OFF state of the switches S1 to S4 and Sa and confirms whether or not a result of the measurement is 0 V (step S13).

If the measurement result is 0 V (YES in step S13), the microcomputer 15 considers that the read capacitor Ca charged by the charge supply circuit 17 has discharged although the switch Sa is OFF and determines that an input part of the first A/D conversion port A/D1 of the microcomputer 15 is faulty (for example, an open fault of the read capacitor Ca, i.e., Failure (1)) (step S15). Then, the process ends.

On the other hand, if the measurement result is not 0 V (NO in step S13), the microcomputer 15 starts to discharge the flying capacitor C1 (step S17). Slightly after that, the microcomputer 15 starts to charge the read capacitor Ca (step S19) and carries out a failure measurement 2 (refer to FIG. 4) (step S21).

In the failure measurement 2, the microcomputer 15 measures potential corresponding to a charge voltage of the read capacitor Ca in an ON state of the switches S3, S4, and Sa and confirms whether or not a result of the measurement is 0 V (step S23).

If the measurement result is 0 V (YES in step S23), the microcomputer 15 considers that the read capacitor Ca charged with a discharge voltage (charge voltage) of the flying capacitor C1 has discharged through the switch Sa that is ON and determines that the ground fault detecting circuit 11 is faulty (for example, a breakage in the main wiring 1p and 1n, i.e., Failure (2)) (step S25). Then, the process ends.

On the other hand, if the measurement result is not 0 V (NO in step S23), the microcomputer 15 terminates the charging of the read capacitor Ca (step S27) and confirms whether or not the normal measurement has been carried out (step S29). If it is confirmed that the normal measurement has been carried out (YES in step S29), the microcomputer 15 confirms whether or not a result of the measurement is 0 V (step S31).

If the measurement result is 0 V (YES in step S31), the process ends. On the other hand, if it is not 0 V (NO in step S31), the microcomputer 15 considers that the read capacitor Ca has never discharged and determines that the peak holder 13 has an open fault (for example, an open fault of the switch Sa, i.e., Failure (3)) (step S33). Then, the process ends.

Figure 6:
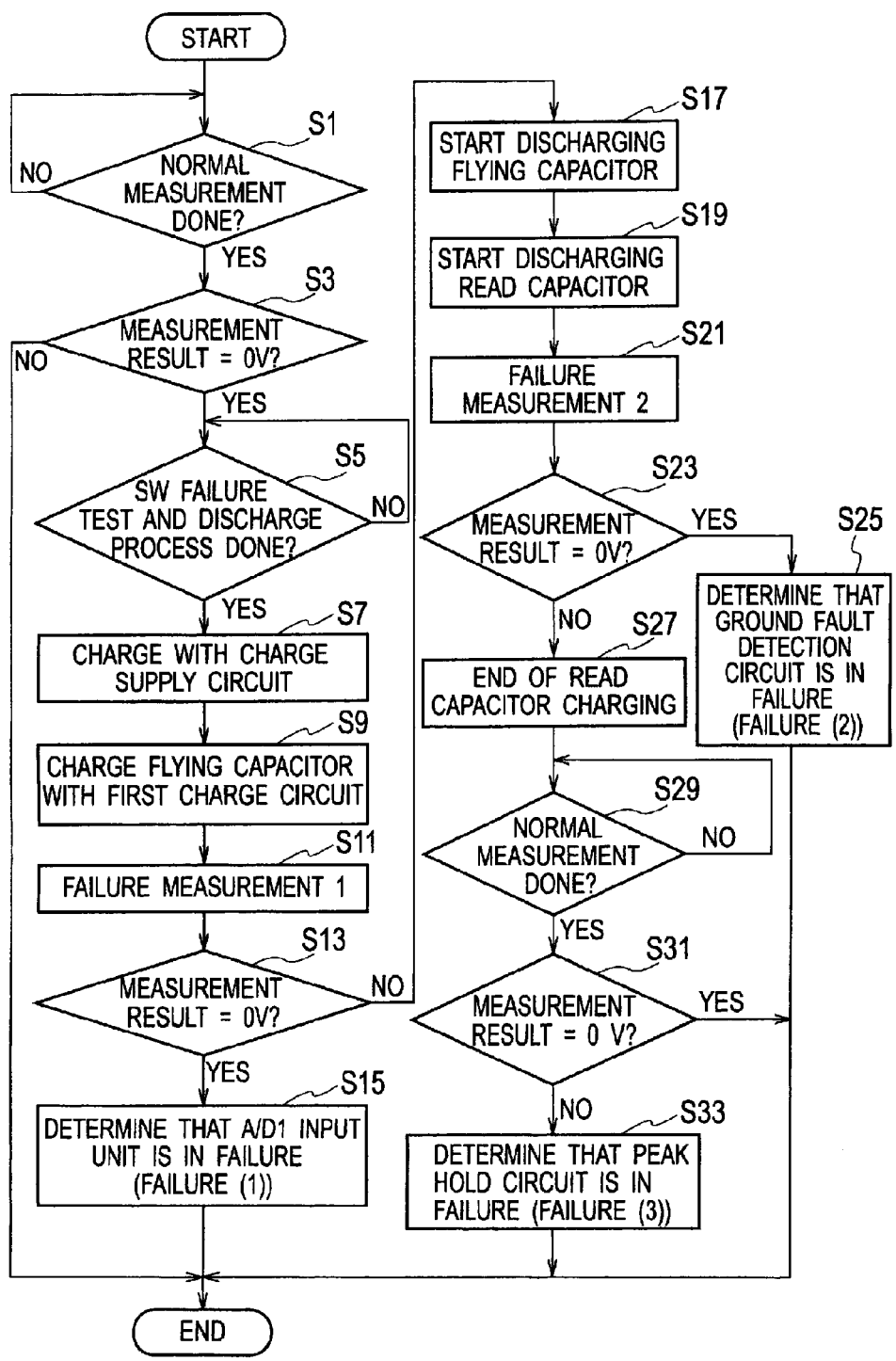

As is apparent from the above explanation, the embodiment realizes the hold value measuring unit stipulated in the claims with steps S1 and S29 (YES in each step) of the flowchart illustrated in FIG. 6 and components of the ground fault detector 11 and sample and hold circuit 13 that are involved in executing the normal measurement.

According to the embodiment, step S7 in FIG. 6 is a process corresponding to the test charger stipulated in the claims. According to the embodiment, steps S11 and S21 in FIG. 6 correspond to the test measuring unit stipulated in the claims. According to the embodiment, steps S15, S25, and S33 in FIG. 6 correspond to the fault detector stipulated in the claims.

According to the insulated condition detector 10 of the embodiment with the above-mentioned configuration, a discharge voltage of the flying capacitor C1 just after the start of discharge of the flying capacitor C1 is used as a peak value to charge the read capacitor Ca of the peak holder 13 and the microcomputer 15 measures a charge voltage of the read capacitor Ca. For this, the below-mentioned configuration is adopted.

If the charge voltage of the read capacitor Ca measured by the microcomputer 15 is zero (0 V), the microcomputer 15 measures a charge voltage of the read capacitor Ca after the read capacitor Ca is discharged and is charged by the charge supply circuit 17 to predetermined potential, measures the same when the read capacitor Ca is isolated thereafter from the discharge circuit of the flying capacitor C1, and measures the same when the read capacitor Ca is charged thereafter with a discharge voltage of the flying capacitor C1 just after the start of discharge of the flying capacitor C1.

Based on a pattern of the charge voltage values of the read capacitor Ca measured at the respective time points, a faulty location in the insulated condition detector 10 is identified.

When an insulated condition is detected by use of the peak holder 13, the insulated condition detector 10 is tested if it has a fault, to improve the accuracy of the insulated condition detection.

The insulated condition detector according to the present invention is capable of clarifying the cause if a discharge voltage value of the flying capacitor at the start of discharge thereof held by the peak holder is apparently abnormal.

If a value measured by the hold value measuring unit is zero (potential of 0 V), the flying capacitor fault detector of the insulated condition detector according to the present invention determines that the hold capacitor is not charged when the flying capacitor is discharged, or a peak value of the discharge voltage of the flying capacitor is 0 V. Such a state never occurs in a normal state, and therefore, it is presumed that the insulated condition detector is faulty.

In this case, whether or not the hold capacitor has an open fault is detected according to whether or not a charge voltage of the hold capacitor measured by the test measuring unit after the charging by the test charging unit is 0 V. Namely, if potential held by the peak holder corresponding to a charge voltage of the hold capacitor is apparently abnormal (0 V), it is clarified if the cause thereof is the hold capacitor.

If a charge voltage of the hold capacitor measured by the test measuring unit in a state that the hold capacitor is isolated from the discharge circuit is 0 V, it is detected that the hold capacitor has an open fault.

If the charge voltage of the hold capacitor measured by the test measuring unit in the state that the hold capacitor is isolated from the discharge circuit is not 0 V and if a charge voltage of the hold capacitor measured by the test measuring unit in a state that the hold capacitor is connected to the discharge circuit is 0 V, it is detected that a fault is present on the discharge circuit side from the switch unit.

Accordingly, a fault location detecting range is expanded to the outside of the peak holder and a fault location of the insulated condition detector is identified in the wider range.

If the value measured by the hold value measuring unit is zero (potential of 0 V) and if the charge voltage of the hold capacitor measured thereafter by the test measuring unit is not 0 V in the state that the hold capacitor is isolated from the discharge circuit and in the state that the same is connected to the discharge circuit, and in addition, if a value measured thereafter by the hold value measuring unit is not zero, it is detected that there is an open fault of, for example, the switch unit in the peak holder.

In this way, objects in the peak holder to be tested for locating a fault can be increased to precisely identify a fault location in the insulated condition detector.

(United States Designation)

In connection with United States designation, this application claims benefit of priority under 35USC 119 to Japanese Patent Application No. 2011-051640 filed on Mar. 9, 2011, the entire content of which is incorporated by reference herein.

The invention claimed is:

1. An insulated condition detector for detecting an insulated condition of a DC power source insulated from a ground potential portion according to a charge voltage of a flying capacitor charged with a charge amount corresponding to a voltage of the DC power source and a charge voltage of the flying capacitor through an insulation resistance measuring circuit of the DC power source including an insulation resistance of the DC power source, the insulated condition detector comprising:
   a peak holder being selectively connected to a discharger of the flying capacitor at the start of discharge of the flying capacitor and configured to charge a hold capacitor with potential corresponding to a peak value of a discharge voltage of the flying capacitor and hold the potential;
   a hold value measuring unit configured to measure the potential held in the peak holder after the start of discharge of the flying capacitor and in a state that the peak holder is electrically isolated from the discharger;
   a charge voltage detector configured to detect a charge voltage of the flying capacitor according to the value measured by the hold value measuring unit;
   a test charger configured to charge the hold capacitor with predetermined potential in the electrically insulated state from the discharger if the potential held in the peak holder and measured by the hold value measuring unit is zero;
   a test measuring unit configured to measure a charge voltage of the hold capacitor after the charging by the test charging unit; and
   a fault detector configured to detect a fault location according to the values measured by the hold value measuring unit and test measuring unit.

2. The insulated condition detector of claim 1, wherein after the charging by the test charger, the test measuring unit measures a charge voltage of the hold capacitor in a state that the hold capacitor is electrically isolated from the discharger, as well as in a state that the same is connected to the discharger.

3. The insulated condition detector of claim 1, wherein the fault detector detects a fault location according to the value measured by the test measuring unit and the values measured by the hold value measuring unit before and after the measurement of the test measuring unit.

\* \* \* \* \*